United States Patent
Huang et al.

(10) Patent No.: US 11,840,047 B2
(45) Date of Patent: Dec. 12, 2023

(54) METAL-CLAD LAMINATE, PRINTED CIRCUIT BOARD, AND METHOD FOR MANUFACTURING THE SAME

(71) Applicant: TAIWAN UNION TECHNOLOGY CORPORATION, Chupei (TW)

(72) Inventors: Shi-Ing Huang, Chupei (TW); Shur-Fen Liu, Chupei (TW); Kai-Hsiang Lin, Chupei (TW)

(73) Assignee: TAIWAN UNION TECHNOLOGY CORPORATION, Chupei (TW)

(*) Notice: Subject to any disclaimer, the term of this patent is extended or adjusted under 35 U.S.C. 154(b) by 21 days.

(21) Appl. No.: 16/783,909

(22) Filed: Feb. 6, 2020

(65) Prior Publication Data
US 2021/0060900 A1 Mar. 4, 2021

(30) Foreign Application Priority Data
Sep. 4, 2019 (TW) ................................. 108132165

(51) Int. Cl.
*B32B 15/14* (2006.01)
*B32B 5/02* (2006.01)
(Continued)

(52) U.S. Cl.
CPC ................ *B32B 15/14* (2013.01); *B32B 5/02* (2013.01); *B32B 15/20* (2013.01); *B32B 27/12* (2013.01);
(Continued)

(58) Field of Classification Search
CPC ............. H05K 1/036; H05K 2201/015; H05K 2201/0195; H05K 1/0353; C09J 7/21;
(Continued)

(56) References Cited

U.S. PATENT DOCUMENTS 2,989,433 A * 6/1961 Yuan ....................... B32B 15/08
156/313
3,136,680 A * 6/1964 Hochberg .............. H05K 1/036
427/370
(Continued)

FOREIGN PATENT DOCUMENTS

| CN | 101080957 B | 4/2010 |
| CN | 101838431 B | 11/2012 |

(Continued)

OTHER PUBLICATIONS

IPC-TM-650 Test Methods Manual, No. 2.4.24.4, The Institute for Interconnecting and Packaging Electronic Circuits, Nov. 1998. (Year: 1998).*

(Continued)

*Primary Examiner* — Monique R Jackson
(74) *Attorney, Agent, or Firm* — Christensen, Fonder, Dardi & Herbet PLLC

(57) ABSTRACT

A metal-clad laminate, a printed circuit board using the same and a method for manufacturing the metal-clad laminate. The metal-clad laminate comprises:
a first dielectric layer, comprising a first dielectric material and not comprising a reinforcing fabric, the first dielectric material comprising 20 wt % to 60 wt % of a first fluoropolymer and 40 wt % to 80 wt % of a first filler;
a second dielectric layer disposed on one side of the first dielectric layer and comprising a reinforcing fabric and a second dielectric material formed on the surface of the reinforcing fabric, wherein the thickness of the reinforcing fabric is not higher than 65 μm and the second dielectric material comprises 55 wt % to 100 wt % of a second fluoropolymer and 0 to 45 wt % of a second filler; and (Continued)

a metal foil disposed on the other side of the second dielectric layer that is opposite to the first dielectric layer.

9 Claims, 1 Drawing Sheet

(51) Int. Cl.
*B32B 15/20* (2006.01)
*B32B 27/12* (2006.01)
*H05K 1/03* (2006.01)
*B32B 27/20* (2006.01)
*H05K 3/02* (2006.01)
*B32B 27/32* (2006.01)
*B32B 27/30* (2006.01)

(52) U.S. Cl.
CPC ............ *B32B 27/20* (2013.01); *B32B 27/304* (2013.01); *B32B 27/322* (2013.01); *H05K 1/036* (2013.01); *H05K 3/022* (2013.01); *B32B 2250/05* (2013.01); *B32B 2250/40* (2013.01); *B32B 2260/021* (2013.01); *B32B 2260/046* (2013.01); *B32B 2262/101* (2013.01); *B32B 2264/102* (2013.01); *B32B 2307/204* (2013.01); *B32B 2457/08* (2013.01); *H05K 2201/015* (2013.01); *H05K 2201/0191* (2013.01); *H05K 2201/0195* (2013.01)

(58) Field of Classification Search
CPC .. C09J 127/12–20; B32B 15/14; B32B 15/08; B32B 15/085; B32B 2250/05; B32B 2250/40; B32B 2457/08; B32B 27/12; B32B 27/304; B32B 27/322; B32B 2260/046; B32B 15/082; B32B 27/08; B32B 2262/101; B32B 2264/102; B32B 2264/1021

See application file for complete search history.

(56) References Cited

U.S. PATENT DOCUMENTS

| | | |
|---|---|---|
| 3,556,161 A | 1/1971 | Roberts |
| 4,335,180 A | 6/1982 | Traut |
| 4,849,284 A | 7/1989 | Arthur et al. |
| 4,895,752 A * | 1/1990 | McEwen ............... B32B 15/08 428/458 |
| 2003/0072929 A1* | 4/2003 | McCarthy .............. H05K 1/034 428/209 |
| 2003/0082363 A1* | 5/2003 | Nakagiri ............... H05K 3/4069 428/313.3 |
| 2003/0203174 A1* | 10/2003 | McCarthy ............ H05K 3/4626 428/209 |
| 2005/0153610 A1* | 7/2005 | McCarthy ............ C09D 127/12 442/59 |
| 2005/0161149 A1* | 7/2005 | Yokota .................. C25D 15/02 156/151 |
| 2008/0107866 A1 | 5/2008 | Iwasa et al. |
| 2012/0132462 A1* | 5/2012 | Harazono ................ H05K 3/42 174/260 |
| 2016/0107376 A1 | 4/2016 | Nakajima et al. |
| 2016/0227647 A1* | 8/2016 | Guy ........................ B32B 15/20 |
| 2017/0327683 A1* | 11/2017 | Hu .......................... C08L 35/06 |
| 2018/0086911 A1* | 3/2018 | Yao ............................ C08J 5/24 |
| 2018/0339493 A1 | 11/2018 | Chen et al. |
| 2019/0016874 A1* | 1/2019 | Hsieh ...................... C08L 75/14 |
| 2020/0053877 A1* | 2/2020 | Liu ....................... H05K 1/0373 |
| 2020/0165501 A1* | 5/2020 | Liao ...................... C09D 127/18 |

FOREIGN PATENT DOCUMENTS

| | | | | |
|---|---|---|---|---|
| CN | 104558688 A | * | 4/2015 | |
| CN | 103102627 B | | 9/2015 | |
| CN | 105339166 A | | 2/2016 | |
| CN | 108358505 A | | 8/2018 | |
| CN | 108966534 A | | 12/2018 | |
| JP | 2007314720 A | * | 12/2007 | ............. H05K 1/024 |

OTHER PUBLICATIONS

Machine translation of JP2007314720A, published Dec. 2007, Powered by EPO and Google. (Year: 2007).*

Machine translation of CN104558688A, published Apr. 2015, Powered by EPO and Google. (Year: 2015).*

Engineering ToolBox, (2003). Coefficients of Linear Thermal Expansion. [online] Available at: https://www.engineeringtoolbox.com/linear-expansion-coefficients-d_95.html [Accessed May 5, 2020]. (Year: 2003).*

Saint-Gobain Vetrotex, Textiles E, R and D glass properties, Technical data sheet, Mar. 2002. (Year: 2002).*

\* cited by examiner

METAL-CLAD LAMINATE, PRINTED CIRCUIT BOARD, AND METHOD FOR MANUFACTURING THE SAME

CLAIM FOR PRIORITY

This application claims the benefit of Taiwan Patent Application No. 108132165 filed on Sep. 4, 2019, the subject matters of which are incorporated herein in their entirety by reference.

BACKGROUND OF THE INVENTION

Field of the Invention

The present invention provides a metal-clad laminate, especially, a fluoropolymer metal-clad laminate, and a manufacturing method of the same. The fluoropolymer metal-clad laminate of the present invention is particularly suitable for use as a circuit substrate in high-frequency technical fields, including radio frequency (RF) applications, microwave applications, mm wave applications, antenna applications, radar applications, and the like. In particular, the fluoropolymer metal-clad laminate of the present invention can meet the need for high-level materials in advanced applications, such as 5th generation mobile networks (5G), advanced driver assistance systems (ADAS), and artificial intelligence (AI).

Descriptions of the Related Art

As a result of the development of high-frequency and high-speed electronic products, miniaturization of electronic elements, and high-density wiring on substrates, there are higher demands on the requirements for the physicochemical properties of the electronic materials that are used. However, the characteristics of conventional epoxy resin dielectric materials have failed to keep up with the requirements, and thus, conventional dielectric materials used for metal-clad laminates are being replaced with fluoropolymers, such as polytetrafluoroethylene (PTFE). Generally, when a fluoropolymer is used as a dielectric material in a metal-clad laminate, the metal-clad laminate prepared therefrom will not only have excellent electrical properties (wherein both the dielectric constant (Dk) and the dielectric dissipation factor (Df) are low), but also have good chemical acid and alkali resistance, moisture resistance, and flame retardance.

A glass fabric-free type fluoropolymer laminate was first disclosed in U.S. Pat. No. 3,556,161, wherein PTFE powders were used to prepare a dielectric layer. Soon after, another laminate was disclosed in U.S. Pat. No. 4,335,180, wherein a dough-like material consisting of fluoropolymers, ceramic fillers, microfibers, and flocculants was subjected to extrusion to obtain a dielectric layer, and then a copper foil was further attached thereto to obtain a copper clad laminate. U.S. Pat. No. 4,849,284 further proposed conducting a surface treatment on the ceramic fillers by using a coupling agent, and then adding the ceramic fillers to a fluoropolymer resin, wherein the copper clad laminate prepared therefrom has desirable properties such as a low Dk and a low Df. As shown in FIG. 1, the method for manufacturing the laminate described above is to directly press metal foils 12 on a dielectric layer 11 to form a metal-clad laminate 1. However, because the laminate made therefrom does not contain a glass fabric as reinforcing material, the stiffness of the laminate is insufficient. In the subsequent drilling process of a printed circuit board (PCB), the laminate is easily deformed due to the pressure exerted by the drill, thereby, affecting the accuracy of the positions of the drilled holes.

Therefore, there is a need for a technical solution that can provide a fluoropolymer laminate with good stiffness.

SUMMARY OF THE INVENTION

In view of the abovementioned technical problems, the present invention provides a metal-clad laminate, wherein by using a combination of a dielectric layer not containing a reinforcing fabric and a dielectric layer containing a reinforcing fabric in a fluoropolymer laminate, the overall stiffness of the laminate is improved without affecting the appearance flatness of the laminate.

The present invention has solved the problem of the prior art that generally exists when the dielectric layer does not contain a reinforcing fabric: due to insufficient stiffness, the laminate is easily deformed in the subsequent drilling process of a printed circuit board, thereby, affecting the accuracy of the positions of the drilled holes.

As such, an objective of the present invention is to provide a metal-clad laminate, which comprises the following components:

a first dielectric layer, which comprises a first dielectric material and does not comprise a reinforcing fabric, wherein the first dielectric material comprises 20 wt % to 60 wt % of a first fluoropolymer and 40 wt % to 80 wt % of a first filler;

a second dielectric layer, which is disposed on at least one side of the first dielectric layer and comprises a reinforcing fabric and a second dielectric material formed on the surface of the reinforcing fabric, wherein the thickness of the reinforcing fabric is not higher than 65 μm and the second dielectric material comprises 55 wt % to 100 wt % of a second fluoropolymer and 0 to 45 wt % of a second filler; and a metal foil, which is disposed on the other side of the second dielectric layer that is opposite to the first dielectric layer.

In some embodiments of the present invention, the first fluoropolymer and the second fluoropolymer are each independently selected from the group consisting of polytetrafluoroethylene (PTFE), tetrafluoroethylene-hexafluoropropylene copolymer (FEP), tetrafluoroethylene-perfluorinated alkyl vinyl ether copolymer, and combinations thereof.

In some embodiments of the present invention, the melting point of the second fluoropolymer is lower than the melting point of the first fluoropolymer.

In some embodiments of the present invention, the reinforcing fabric is a glass fabric.

In some embodiments of the present invention, the reinforcing fabric is selected from the group consisting of E-glass fabric, NE-glass fabric, S-glass fabric, L-glass fabric, D-glass fabric, quartz glass fabric, aromatic polyamide fabric (such as Kevlar fabric), polytetrafluoroethylene (PTFE) fabric, polyester fabric, and liquid crystal polymer (LCP) fabric.

In some embodiments of the present invention, the reinforcing fabric has a thickness of no more than 40 μm.

In some embodiments of the present invention, the first filler and the second filler are each independently selected from the group consisting of silica (including spherical silica, fused silica, non-fused silica, porous silica, hollow silica, and nano silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE) powders, glass beads, ceramic whiskers, carbon nanotubes, nanosized inorganic powders, strontium titanate, and combinations thereof.

In some embodiments of the present invention, the metal-clad laminate has a storage modulus of more than 4000 MPa, as measured by using a dynamic mechanical analyzer at a frequency of 1 Hz and a temperature of 70° C.

Another objective of the present invention is to provide a printed circuit board, which is prepared from the aforementioned metal-clad laminate.

Yet another objective of the present invention is to provide a manufacturing method of a metal-clad laminate, which comprises the following steps:

providing a first dielectric layer, which comprises a first dielectric material and does not comprise a reinforcing fabric, wherein the first dielectric material comprises 20 wt % to 60 wt % of a first fluoropolymer and 40 wt % to 80 wt % of a first filler;

providing a second dielectric layer and disposing the second dielectric layer on at least one side of the first dielectric layer, wherein the second dielectric layer comprises a reinforcing fabric and a second dielectric material formed on the surface of the reinforcing fabric, wherein the thickness of the reinforcing fabric is not higher than 65 μm and the second dielectric material comprises 55 wt % to 100 wt % of a second fluoropolymer and 0 to 45 wt % of a second filler;

providing a metal foil and disposing the metal foil on the other side of the second dielectric layer that is opposite to the first dielectric layer to provide a superimposed object; and performing a hot-pressing step on the superimposed object to provide a metal-clad laminate.

To render the above objectives, technical features and advantages of the present invention more apparent, the present invention will be described in detail with reference to some embodiments hereinafter.

DESCRIPTION OF THE PREFERRED EMBODIMENTS

Hereinafter, some embodiments of the present invention will be described in detail. However, without departing from the spirit of the present invention, the present invention may be embodied in various embodiments and should not be limited to those described in the specification. Unless it is additionally explained, the expressions "a," "the," or the like recited in the specification (especially in the claims) should include both the singular and the plural forms.

Unless it is additionally explained, while describing components in a solution, mixture, composition, or varnish in the specification, the amount of each component is calculated based on the dry weight, i.e., regardless of the weight of the solvent.

Unless it is additionally explained, the expressions "first," "second," or the like recited in the specification (especially in the claims) are only used to distinguish different elements or components. They do not have special meanings and are not intended to indicate sequential order.

Unless it is additionally explained, when referring to "impregnate" as a technical method in the specification, it should be understood that the technical method includes dipping, coating, spraying or other technical methods that have essentially the same function or efficacy.

As described above, the present invention uses a combination of a dielectric layer not containing a reinforcing fabric and a dielectric layer containing a reinforcing fabric in a fluoropolymer laminate, and therefore, the overall stiffness of the laminate is improved without affecting the appearance flatness of the laminate. The technical features and efficacy of the present invention are described below via some embodiments.

1. METAL-CLAD LAMINATE

Figure 1:
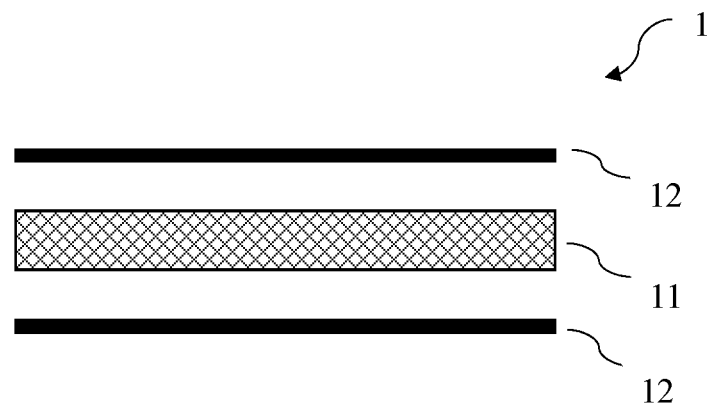
FIG. 1 is a schematic diagram showing a metal-clad laminate of the prior art.
Figure 2:
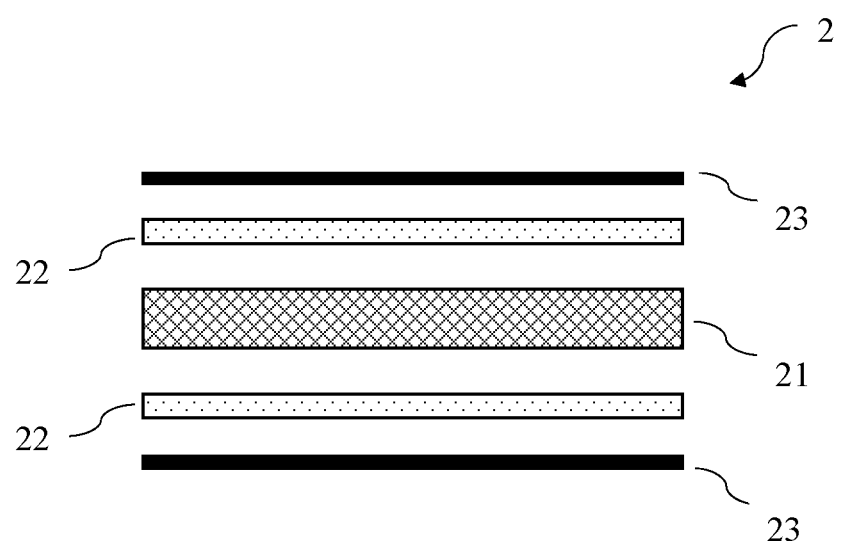
FIG. 2 is a schematic diagram showing an embodiment of the metal-clad laminate of the present invention.

The metal-clad laminate of the present invention comprises a first dielectric layer, a second dielectric layer disposed on at least one side of the first dielectric layer, and a metal foil disposed on the other side of the second dielectric layer that is opposite to the first dielectric layer. FIG. 2 is a schematic diagram showing an embodiment of the metal-clad laminate of the present invention. To show each element independently and clearly, the stacking structure of the metal-clad laminate is shown in a separate way. As shown in FIG. 2, a metal-clad laminate 2 comprises a first dielectric layer 21, second dielectric layers 22, and metal foils 23, wherein one layer of second dielectric layer 22 is disposed on each of the two sides of the first dielectric layer 21, and one metal foil 23 is disposed on each of the other sides of the second dielectric layers 22 opposite to the first dielectric layer 21.

In some embodiments of the present invention, the metal-clad laminate has a storage modulus of more than 4000 MPa, preferably more than 5000 MPa, and more preferably more than 11000 MPa. This is measured by using a dynamic mechanical analyzer at a frequency of 1 Hz and a temperature of 70° C.

1.1. First Dielectric Layer of the Metal-Clad Laminate

The first dielectric layer comprises a first dielectric material and does not comprise a reinforcing fabric, where the definition of "reinforcing fabric" will be described in detail in section 1.2.1. below. In some embodiments, the first dielectric layer consists essentially of a first dielectric material or consists of a first dielectric material.

The first dielectric material comprises a first fluoropolymer and a first filler. In some embodiments, the first dielectric material consists essentially of a first fluoropolymer and a first filler, or consists of a first fluoropolymer and a first filler. Based on the total weight of the first dielectric material, the amount of the first fluoropolymer ranges between 20 wt % to 60 wt %, such as 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, or 59 wt %. Based on the total weight of the first dielectric material, the amount of the first filler ranges between 40 wt % to 80 wt %, such as 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, or 79 wt %. If the amount of the first filler is lower than the above range (such as lower than 40 wt %), the dimensional stability of the metal-clad laminate will be poor; on the other hand, if the amount of the first filler is higher than the above range (such as higher than 80 wt %), the evenness of the thickness and the peeling strength of the metal-clad laminate will be poor.

The first fluoropolymer and the second fluoropolymer that will be described below refer to a homopolymer or a copolymer which contains fluorine atoms, specifically, a fluorocarbon-based polymer with multiple strong carbon-fluorine bonds. Generally, fluorine-containing polymers have characteristics such as solvent resistance, acid resistance and alkali resistance, and have excellent stability due to the strong carbon-fluorine bonds. In addition, fluorine-containing polymers also have excellent dielectric characteristics and a broad working temperature range, and can be applied in various industrial fields, such as electronic, chemical, and mechanical production.

Specifically, the first fluoropolymer and the second fluoropolymer that will be described below can independently be a homopolymer of a monomer selected from the following group, a copolymer of two or more monomers selected from the following group, or a copolymer of monomers selected from the following group and other co-monomers: tetrafluoroethylene, vinylidene fluoride, vinyl fluoride, perfluoroether, chlorotrifluoroethylene, and hexafluoropropylene. The perfluoroether includes perfluoroethers that contain alkenyl groups, such as perfluoroalkyl vinyl ether. Examples of perfluoroalkyl vinyl ether include but are not limited to perfluoromethyl vinyl ether. Examples of other co-monomers include but are not limited to perfluorobutyl ethylene, ethylene, propylene, and butylene.

Examples of the first fluoropolymer or the second fluoropolymer that will be described below include polytetrafluoroethylene (PTFE), tetrafluoroethylene-hexafluoropropylene copolymer (FEP), tetrafluoroethylene-perfluoroalkyl vinyl ether copolymer (FPA), tetrafluoroethylene-hexafluoropropylene-perfluoroalkyl vinyl ether copolymer, polychlorotrifluoroethylene (PCTFE), polyvinylidene fluoride, polyvinyl fluoride, and tetrafluoroethylene-ethylene copolymer. Each of the fluoropolymers can either be used alone or in any combination. In some embodiments of the present invention, the first fluoropolymer and the second fluoropolymer are each independently polytetrafluoroethylene, tetrafluoroethylene-hexafluoropropylene copolymer, tetrafluoroethylene-perfluoroalkyl vinyl ether copolymer, or any combination thereof.

The types of the first filler and the second filler that will be described below are not particularly limited, and can be selected depending on the needs by persons having ordinary skill in the art. The fillers are selected to specifically improve properties of the metal-clad laminate, such as mechanical strength, thermal conductivity, or dimensional stability. In addition, the first filler and the second filler can be the same or different from each other. Examples of the first filler and the second filler include but are not limited to silica (including spherical silica, fused silica, non-fused silica, porous silica, hollow silica, and nano silica), aluminum oxide, magnesium oxide, magnesium hydroxide, calcium carbonate, talc, clay, aluminum nitride, boron nitride, aluminum hydroxide, silicon silicon carbide, silicon carbide, sodium carbonate, titanium dioxide, zinc oxide, zirconium oxide, quartz, diamond, diamond-like carbon, graphite, calcined kaolin, pryan, mica, hydrotalcite, hollow silica, polytetrafluoroethylene powders, glass beads, ceramic whiskers, carbon nanotubes, nanosized inorganic powders, and strontium titanate. The foregoing fillers can either be used alone or in any combination. In the appended examples, the first filler is silica.

1.2. Second Dielectric Layer of the Metal-Clad Laminate

The second dielectric layer comprises a reinforcing fabric and a second dielectric material formed on the surface of the reinforcing fabric. In some embodiments, the second dielectric layer consists essentially of a reinforcing fabric and a second dielectric material, or consists of a reinforcing fabric and a second dielectric material. The second dielectric layer is disposed on at least one side of the first dielectric layer. In some embodiments, the second dielectric layers are disposed on two sides of the first dielectric layer.

1.2.1. Reinforcing Fabric

The reinforcing fabric refers to a fabric structural reinforcing material which is made of fibrous materials and in the form of woven fabric and non-woven fabric. Examples of the reinforcing fabric include but are not limited to materials with high thermal stability, such as E-glass fabric, NE-glass fabric, S-glass fabric, L-glass fabric, D-glass fabric, quartz glass fabric, aromatic polyamide fabric (such as Kevlar fabric), polytetrafluoroethylene fabric, polyester fabric, aromatic polyester fabric, and liquid crystal polymer fabric.

To prevent the metal-clad laminate from being too thick and having poor appearance flatness, the thickness of the reinforcing fabric is preferably no more than 65 and more preferably no more than 45 Specifically, examples of the reinforcing fabric include woven glass fabric of E-glass fabric or NE-glass fabric of the following model No.: 1080-type (64 μm), 1086-type (50 μm), 1078-type (40 μm), 106-type (32 μm), 1067-type (35 μm), 1037-type (30 μm), and 1035-type (30 μm).

1.2.2. Second Dielectric Material

The second dielectric material comprises a second fluoropolymer and an optional second filler. In some embodiments, the second dielectric material consists essentially of a second fluoropolymer and a second filler, or consists of a second fluoropolymer and a second filler. Based on the total weight of the second dielectric material, the amount of the second fluoropolymer ranges between 55 wt % to 100 wt %, such as 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, 95 wt %, 96 wt %, 97 wt %, 98 wt %, or 99 wt %. Based on the total weight of the second dielectric material, the amount of the second filler ranges between 0 to 45 wt %, such as 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, or 44 wt %. If the amount of the second filler is higher than the above range (such as higher than 45 wt %), the evenness of the thickness and the peeling strength of the metal-clad laminate will be poor.

The definition and the examples of the second fluoropolymer are as described above. The types of the first fluoropolymer and the second fluoropolymer can be the same or different from each other. In some embodiments of the present invention, the second fluoropolymer is different from the first fluoropolymer and the melting point of the second fluoropolymer is lower than the melting point of first fluoropolymer. For example, the melting point of the first fluoropolymer can range between 325° C. to about 340° C., and the melting point of the second fluoropolymer can range between 250° C. to about 320° C. As such, the resin flow characteristic of the second fluoropolymer is better than that of the first fluoropolymer during the hot-pressing process, thereby, improving the adhesion between the dielectric layer and the metal foil. Specifically, the first fluoropolymer may be polytetrafluoroethylene (PTFE, having a melting point of about 330° C.) and the second fluoropolymer may be tetrafluoroethylene-perfluoromethyl vinyl ether copolymer (with a melting point of about 310° C.) or tetrafluoroethylene-hexafluoropropylene copolymer (FEP, with a melting point of about 260° C.). Tetrafluoroethylene-perfluoromethyl vinyl ether copolymer and tetrafluoroethylene-hexafluoropropylene copolymer can provide a better resin flow characteristic than polytetrafluoroethylene can during the hot-pressing process. Regarding information on the resin flow characteristic and other properties of tetrafluoroethylene-perfluoromethyl vinyl ether copolymer and tetrafluoroethylene-hexafluoropropylene copolymer, reference may be made to patent documents, such as CN 101838431 B and CN 103102627 B to Sheng Yi Technology Co., Ltd., the subject matters of which are incorporated herein in their entirety by reference.

The definition and the examples of the second filler are as described above. In the appended examples, silica is used as the second filler.

1.3. Metal Foil of the Metal-Clad Laminate

Examples of the metal foil include but are not limited to materials with good electrical conductivity, such as copper, stainless steel, aluminum, zinc, iron, nickel, gold, silver, transition metals, or alloys of two or more of the foregoing metals. In some embodiments of the present invention, a copper foil is used, and the surface of the copper foil may or may not be subjected to roughening. Examples of the copper foil include but are not limited to high temperature elongation (HTE) copper foil (surface roughness Ra: 6 μm to 10 μm), reverse treatment foil (RTF) (Ra: 2 μm to 5 μm), very low profile (VLP) copper foil (Ra: less than 2 μm), and hyper very low profile (HVLP) copper foil (Ra: less than 1.5 μm).

2. PRINTED CIRCUIT BOARD

The metal-clad laminate of the present invention can be formed into a printed circuit board by further patterning the external metal foil thereof. Therefore, the present invention also provides a printed circuit board, which is prepared by further patterning the external metal foil of the laminate of the present invention. The method for patterning the metal foil is not particularly limited, and examples thereof include but are not limited to photolithography, screen printing, and ink-jet printing.

3. MANUFACTURING METHOD OF A METAL-CLAD LAMINATE

The manufacturing method of a metal-clad laminate of the present invention comprises the following steps:

providing a first dielectric layer, which comprises a first dielectric material and does not comprise a reinforcing fabric, wherein the first dielectric material comprises 20 wt % to 60 wt % of a first fluoropolymer and 40 wt % to 80 wt % of a first filler;

providing a second dielectric layer and disposing the second dielectric layer on at least one side of the first dielectric layer, wherein the second dielectric layer comprises a reinforcing fabric and a second dielectric material formed on the surface of the reinforcing fabric, wherein the thickness of the reinforcing fabric is not higher than 65 μm and the second dielectric material comprises 55 wt % to 100 wt % of a second fluoropolymer and 0 to 45 wt % of a second filler;

providing a metal foil and disposing the metal foil on the other side of the second dielectric layer that is opposite to the first dielectric layer to provide a superimposed object; and performing a hot-pressing step on the superimposed object to provide a metal-clad laminate.

In the manufacturing method, the definition of the reinforcing fabric, the first dielectric material, the second dielectric material and the metal foil are as described above. In some embodiments of the present invention, the metal-clad laminate is prepared by the following method.

First, a first fluoropolymer, a first filler and optional additives (such as coupling agent and viscosity modifier) are mixed and stirred evenly to form a dough-like mixture; and then the dough-like mixture is subjected to extrusion to form a film, thereby, obtaining a first dielectric layer not containing a reinforcing fabric, wherein the first dielectric layer is in the form of a film or a sheet. Regarding the manufacturing method of the first dielectric layer not containing a reinforcing fabric, reference may also be made to U.S. Pat. Nos. 3,556,161, 4,335,180 and 4,849,284, the subject matters of which are incorporated herein in their entirety by reference.

Then, a second fluoropolymer and a second filler are mixed and dispersed in a solvent to form a varnish, and a reinforcing fabric (such as a glass fabric) is impregnated with the varnish. Then, the impregnated reinforcing fabric is subjected to sintering at a temperature not lower than the melting point of the second fluoropolymer to obtain a second dielectric layer prepreg.

After that, the first dielectric layer, the second dielectric layer prepreg and a metal foil (such as a copper foil) are superimposed to provide a superimposed object, and the superimposed object is subjected to hot-pressing to obtain the fluoropolymer metal-clad laminate of the present invention, wherein the hot-pressing temperature is preferably higher than the melting points of the first fluoropolymer and the second fluoropolymer. The first dielectric layer may be used in the form of a single sheet or multiple sheets being stacked in advance. The second dielectric layer prepreg and the corresponding metal foil can be disposed on one side or two sides of the first dielectric layer (the case of being disposed on two sides is shown in FIG. 2).

4. EXAMPLES

4.1. Testing Method

The present invention is further illustrated by the embodiments hereinafter, wherein the testing instruments and methods are provided below.

[Storage Modulus Test]

The metal-clad laminate of the present invention is etched to remove the copper layer, thereby, obtaining a sample that does not contain copper. The storage modulus test is conducted according to the method described per IPC-TM-650 2.4.24.4, by using a dynamic mechanical analyzer (DMA) at a frequency of 1 Hz and a temperature of 70° C. The unit of the storage modulus is MPa. A higher value for the storage modulus indicates that the substrate has better stiffness (resistance to pressure without deforming).

4.2. List of Raw Materials Used in Examples and Comparative Examples

TABLE 1

List of Raw Materials

| Raw Material | Description and Source |
|---|---|
| DISP30 | PTFE dispersion, available from Chemours Corporation |
| Filler | $SiO_2$ ceramic filler, model No. 1040, available from Novoray |
| HTE copper foil | High temperature elongation copper foil, model No. PLS, available from Chang Chun Group (CCP) |

4.3. Preparation of the Metal-Clad Laminate

Example 1

666.67 grams of PTFE dispersion (the solid content of PTFE being 60 wt %) and 600 grams of $SiO_2$ filler were mixed evenly to form a first varnish (i.e., based on the solid content of the varnish, the amount of the filler being 60 wt %). The first varnish was further stirred to be in a dough-like shape, and then subjected to an extrusion process to obtain a sheet-shaped material. The material was heated to remove the water and surfactant that originally existed in the PTFE dispersion, and then baked at a high temperature of 360° C. to obtain a PTFE dielectric layer not containing a reinforcing fabric (a first dielectric layer).

In addition, 1333.33 grams of PTFE dispersion (the solid content of PTFE being 60 wt %) and 200 grams of $SiO_2$ filler were mixed evenly to form a second varnish (i.e., based on the solid content of the varnish, the amount of the filler being 20 wt %). A 1080-type E-glass fabric (with the thickness being 64 μm) was impregnated with the second varnish. The impregnation was repeated twice to achieve a sufficient amount of resin. The impregnated E-glass fabric was then subjected to baking at a high temperature of 360° C. to obtain a PTFE dielectric layer containing a reinforcing fabric (a second dielectric layer).

One PTFE dielectric layer containing a reinforcing fabric (the second dielectric layer) was stacked on each of the two sides of the PTFE dielectric layer not containing a reinforcing fabric (the first dielectric layer). Finally, one sheet of half-oz HTE copper foil was disposed on each of the upper and lower second dielectric layers. Afterwards, a pressing step was conducted using a high temperature vacuum hot press furnace under the condition of 380° C. and 3 MPa for 90 minutes to obtain a metal-clad laminate of Example 1.

Example 2

666.67 grams of PTFE dispersion (the solid content of PTFE being 60 wt %) and 600 grams of $SiO_2$ filler were mixed evenly to form a first varnish (i.e., based on the solid content of the varnish, the amount of the filler being 60 wt %). The first varnish was further stirred to be in a dough-like shape, and then subjected to an extrusion process to obtain a sheet-shaped material. The material was heated to remove the water and surfactant that originally existed in the PTFE dispersion, and then baked at a high temperature of 360° C. to obtain a PTFE dielectric layer not containing a reinforcing fabric (a first dielectric layer).

In addition, 1333.33 grams of PTFE dispersion (the solid content of PTFE being 60 wt %) and 200 grams of $SiO_2$ filler were mixed evenly to form a second varnish (i.e., based on the solid content of the varnish, the amount of the filler being 20 wt %). A 1067-type E-glass fabric (with the thickness being 35 μm) was impregnated with the second varnish. The impregnation was repeated twice to achieve a sufficient amount of resin. The impregnated E-glass fabric was then subjected to baking at a high temperature of 360° C. to obtain a PTFE dielectric layer containing a reinforcing fabric (a second dielectric layer).

One PTFE dielectric layer containing a reinforcing fabric (the second dielectric layer) was stacked on each of the two sides of the PTFE dielectric layer not containing a reinforcing fabric (the first dielectric layer). Finally, one sheet of half-oz HTE copper foil was disposed on each of the upper and lower second dielectric layers. Afterwards, a pressing step was conducted using a high temperature vacuum hot press furnace under the condition of 380° C. and 3 MPa for 90 minutes to obtain a metal-clad laminate of Example 2.

Comparative Example 1

666.67 grams of PTFE dispersion (the solid content of PTFE being 60 wt %) and 600 grams of $SiO_2$ filler were mixed evenly to form a first varnish (i.e., based on the solid content of the varnish, the amount of the filler being 60 wt %). The first varnish was further stirred to be in a dough-like shape, and then subjected to an extrusion process to obtain a sheet-shaped material. The material was heated to remove the water and surfactant that originally existed in the PTFE dispersion, and then baked at a high temperature of 360° C. to obtain a PTFE dielectric layer not containing a reinforcing fabric. One sheet of half-oz HTE copper foil was disposed on each of the upper and lower sides of the PTFE dielectric layer not containing a reinforcing fabric. Afterwards, a pressing step was conducted using a high temperature vacuum hot press furnace under the condition of 380° C. and 3 MPa for 90 minutes to obtain a metal-clad laminate of Comparative Example 1.

4.4. Property Measurements of the Metal-Clad Laminates

The metal-clad laminates prepared from Examples 1 and 2 and Comparative Examples 1 were etched to remove the copper layer, and then tested to obtain the storage modulus. The test results are shown in table 2 below.

TABLE 2

| | Reinforcing fabric | Storage modulus (MPa) |
|---|---|---|
| Example 1 | 1080-type E-glass fabric | 11475 |
| Example 2 | 1067-type E-glass fabric | 5127 |
| Comparative Example 1 | None | 1481 |

As shown in Table 2, the metal-clad laminates of Example 1 and 2 according to the present invention clearly have higher storage moduli than the metal-clad laminate of Comparative Example 1, which shows that the stiffness is significantly improved.

The above examples are used to illustrate the principle and efficacy of the present invention and show the inventive features thereof, but are not intended to limit the scope of the present invention. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF REFERENCE NUMERALS 1, 2: metal-clad laminate
11: dielectric layer
12, 23: metal foil
21: first dielectric layer
22: second dielectric layer

What is claimed is:

1. A metal-clad laminate, comprising:
   a first dielectric layer, which comprises a first dielectric material and does not comprise a reinforcing fabric, wherein based on the total weight of the first dielectric material, the first dielectric material comprises 20 wt % to 60 wt % of a first fluoropolymer and 40 wt % to 80 wt % of a first filler;
   two second dielectric layers, disposed on opposite sides of the first dielectric layer, wherein the second dielectric layers each comprise a reinforcing fabric and a second dielectric material formed on a surface of the reinforcing fabric, and wherein a thickness of the reinforcing fabric is not higher than 65 μm and based on the total weight of the second dielectric material, the second dielectric material comprises 65 wt % to 100 wt % of a second fluoropolymer and 0 to 35 wt % of a second filler; and
   two metal foils, respectively disposed on the surface of the second dielectric layers that are opposite to the first dielectric layer,
   wherein the first fluoropolymer and the second fluoropolymer are each independently selected from the group consisting of polytetrafluoroethylene (PTFE), tetrafluoroethylene-hexafluoropropylene copolymer (FEP), tetrafluoroethylene-perfluorinated alkyl vinyl ether copolymer, and combinations thereof;
   wherein the first filler and the second filler are each independently silica
   wherein each of the reinforcing fabrics, independently, is a glass fabric; and
   wherein each of the metal foils is a copper foil.

2. The metal-clad laminate of claim 1, wherein the melting point of the second fluoropolymer is lower than the melting point of the first fluoropolymer.

3. The metal-clad laminate of claim 1, wherein each of the reinforcing fabrics, independently, is selected from the group consisting of E-glass fabric, NE-glass fabric, S-glass fabric, L-glass fabric, D-glass fabric, and quartz glass fabric.

4. The metal-clad laminate of claim 1, wherein each of the reinforcing fabrics, independently, has a thickness of no more than 40 μm.

5. The metal-clad laminate of claim 2, wherein each of the reinforcing fabrics, independently, has a thickness of no more than 40 μm.

6. The metal-clad laminate of claim 1, wherein the metal-clad laminate has a storage modulus of more than 4000 MPa, as measured by using a dynamic mechanical analyzer at a frequency of 1 Hz and a temperature of 70° C. after removal of the metal foils.

7. The metal-clad laminate of claim 2, wherein the metal-clad laminate has a storage modulus of more than 4000 MPa, as measured by using a dynamic mechanical analyzer at a frequency of 1 Hz and a temperature of 70° C. after removal of the metal foils.

8. A printed circuit board, which is prepared from the metal-clad laminate of claim 1.

9. A method for manufacturing a metal-clad laminate, comprising:
   providing a first dielectric layer, which comprises a first dielectric material and does not comprise a reinforcing fabric, wherein based on the total weight of the first dielectric material, the first dielectric material comprises 20 wt % to 60 wt % of a first fluoropolymer and 40 wt % to 80 wt % of a first filler;
   providing two second dielectric layers and disposing the second dielectric layers on opposite sides of the first dielectric layer, wherein the second dielectric layers each comprise a reinforcing fabric and a second dielectric material formed on a surface of the reinforcing fabric, and wherein a thickness of the reinforcing fabric is not higher than 65 μm, and based on the total weight of the second dielectric material, the second dielectric material comprises 65 wt % to 100 wt % of a second fluoropolymer and 0 to 35 wt % of a second filler;
   providing two metal foils and disposing the metal foils respectively on the surface of the second dielectric layers that are opposite to the first dielectric layer to provide a superimposed object; and
performing a hot-pressing step on the superimposed object to provide a metal-clad laminate,
wherein the first fluoropolymer and the second fluoropolymer are each independently selected from the group consisting of polytetrafluoroethylene (PTFE), tetrafluoroethylene- hexafluoropropylene copolymer (FEP), tetrafluoroethylene-perfluorinated alkyl vinyl ether copolymer, and combinations thereof;
   wherein the first filler and the second filler are each independently silica
   wherein each of the reinforcing fabrics, independently, is a glass fabric; and
   wherein each of the metal foils is a copper foil.

* * * * *